(12) United States Patent
Frisina et al.

(10) Patent No.: US 7,713,853 B2
(45) Date of Patent: May 11, 2010

(54) METHOD FOR MANUFACTURING ELECTRONIC DEVICES INTEGRATED IN A SEMICONDUCTOR SUBSTRATE AND CORRESPONDING DEVICES

(75) Inventors: Ferrucio Frisina, Sant'Agata li Battiati (IT); Mario Giuseppe Saggio, Acicastello (IT); Angelo Magri, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 156 days.

(21) Appl. No.: 11/971,113

(22) Filed: Jan. 8, 2008

(65) Prior Publication Data

US 2008/0169517 A1      Jul. 17, 2008

Related U.S. Application Data

(63) Continuation-in-part of application No. PCT/EP2006/006672, filed on Jul. 7, 2006.

(30) Foreign Application Priority Data

Jul. 8, 2005   (EP) .................................. 05425491

(51) Int. Cl.
   *H01L 21/00*   (2006.01)
(52) U.S. Cl. ..................... 438/527; 438/268; 438/570
(58) Field of Classification Search .............. 438/268, 438/570, 527
   See application file for complete search history.

(56) References Cited

U.S. PATENT DOCUMENTS

| 5,384,270 | A | 1/1995 | Ueno |
| 5,510,281 | A | 4/1996 | Ghezzo et al. |
| 5,750,429 | A | * | 5/1998 | Kushida | .................. 438/268 |

(Continued)

FOREIGN PATENT DOCUMENTS

EP        0696054 A1     2/1996

(Continued)

OTHER PUBLICATIONS

Vathulya et al., Characterization of Inversion and Accumulation Layer Electron Transport in 4H and 6H-SiC MOSFETs on Implanted P-Type Regions, IEEE Transactions on Electron Devices, Nov. 2000, pp. 2018-2023, vol. 47, No. 11.

*Primary Examiner*—Laura M Menz
(74) *Attorney, Agent, or Firm*—Lisa K. Jorgenson; E. Russell Tarleton; Seed IP Law Group PLLC

(57) ABSTRACT

A method for manufacturing electronic devices on a semiconductor substrate with wide band gap that includes the steps of: forming a screening structure on the semiconductor substrate to include at least a dielectric layer that leaves a plurality of areas of the semiconductor substrate exposed, carrying out at least a ion implantation of a first type of dopant in the semiconductor substrate to form at least a first implanted region, carrying out at least a ion implantation of a second type of dopant in the semiconductor substrate to form at least a second implanted region inside the at least a first implanted region, carrying out an activation thermal process of the first type and second type of dopant with low thermal temperature suitable to complete the formation of the at least first and second implanted regions without diffusing the at least first and at least second type dopants in the substrate.

13 Claims, 9 Drawing Sheets

U.S. PATENT DOCUMENTS

| | | | |
|---|---|---|---|
| 5,817,546 A | | 10/1998 | Ferla et al. |
| 5,841,170 A | * | 11/1998 | Adan et al. ................. 257/345 |
| 5,910,672 A | * | 6/1999 | Iwamatsu et al. ........... 257/347 |
| 6,034,398 A | * | 3/2000 | Kushida ..................... 257/335 |
| 6,048,759 A | | 4/2000 | Hshich et al. |
| 6,171,889 B1 | * | 1/2001 | Iwamatsu et al. ........... 438/162 |
| 6,383,876 B1 | * | 5/2002 | Son et al. .................... 438/289 |
| 7,253,033 B2 | * | 8/2007 | Komatsu .................... 438/149 |
| 7,378,714 B2 | * | 5/2008 | Komatsu .................... 257/392 |
| 7,560,368 B2 | * | 7/2009 | Magri' et al. ................ 438/570 |
| 2003/0122164 A1 | * | 7/2003 | Komatsu .................... 257/219 |
| 2004/0036113 A1 | | 2/2004 | Ueno |
| 2004/0164304 A1 | * | 8/2004 | Magri et al. .................. 257/73 |
| 2004/0188755 A1 | | 9/2004 | Tarui et al. |
| 2004/0197970 A1 | * | 10/2004 | Komatsu .................... 438/163 |
| 2008/0169517 A1 | * | 7/2008 | Frisina et al. ............... 257/408 |

FOREIGN PATENT DOCUMENTS

EP                 1220323 A2      7/2002

* cited by examiner

METHOD FOR MANUFACTURING ELECTRONIC DEVICES INTEGRATED IN A SEMICONDUCTOR SUBSTRATE AND CORRESPONDING DEVICES

BACKGROUND

1. Technical Field

The present disclosure relates to a method for manufacturing electronic devices integrated on a semiconductor substrate, in particular silicon carbide, and, more specifically, to a method for manufacturing electronic devices on a semiconductor substrate with wide band gap. The disclosure also relates to a vertical conduction power electronic MOSFET device integrated on a semiconductor substrate with wide band gap.

The disclosure also make reference to a power electronic MOSFET device integrated on a semiconductor substrate with wide band gap comprising at least a first implanted region of a first type of conductivity, at least a second implanted region of a second type of conductivity formed inside said at least a first implanted region, a gate region projecting from said substrate and insulated therefrom by means of a dielectric layer.

The disclosure particularly, but not exclusively, relates to a method for manufacturing power MOS transistors and the following description is made with reference to this field of application by way of explanation only.

2. Description of the Related Art

As is known, silicon carbide (SiC) is a semiconductor material with wide band gap, i.e., with a band gap energy value Eg higher than 1.1 eV, with such physical characteristics as to make it ideal for the formation of electronic switches for power applications. In the following table some physical parameters are reported of the polytypes that are more common than silicon carbide, compared with silicon (Si).

|  | Si | 3C—SiC | 6H—SiC | 4H—SiC |
|---|---|---|---|---|
| Eg (eV) | 1.1 | 2.3 | 3 | 3.3 |
| Vsn | $1 \times 10^7$ | $2.5 \times 10^7$ | $2 \times 10^7$ | $2 \times 10^7$ |
| μn (cm²/Vs) | 1350 | 1000 | 380 | 947 |
| ∈r | 11.8 | 9.66 | 9.7 | 9.7 |
| Ec (V/cm) | $2 \times 10^5$ | $3 \times 10^6$ | $4 \times 10^6$ | $3 \times 10^6$ |
| K (W/cm K) | 1.5 | 4.9 | 5 | 5 | where Eg is the energy value of the band gap, Vsn is the saturation speed of the electrons, μm is the mobility of the electrons, ∈r is the dielectric constant, Ec is the critical electric field, and k is the thermal conductivity.

From the parameters reported in such table, it is possible to deduce that power electronic devices formed on silicon carbide substrates with respect to power electronic devices formed on silicon substrates have the following advantageous characteristics:

a low output resistance in conduction being the breakdown voltage equal (due to the high value of the critical electric field Ec);

a low leakage current (thanks to the high value of the band gap energy, Eg), high working temperature and high working frequencies (due to the high value of the thermal conductivity k and of the saturation speed Vns).

However, it is well known that to form any electronic device integrated on a silicon carbide substrate it is necessary to introduce dopant elements that produce, inside the reticular matrix of the silicon carbide substrate, some doped regions of the N type or of the P type.

In particular, nitrogen (N) and phosphorus (P) introduce donors into the reticular matrix forming doped regions of the N type, boron (B) and aluminium (Al) introduce acceptors and form doped regions of the P type.

A particularly important technological problem linked to the formation of such doped regions is that any type of dopant implanted in a silicon carbide substrate has a negligible diffusion coefficient D up to temperatures in the order of 1800° C. as described in the article "Properties of Silicon Carbide" by Gary L. Harris. In particular, at such high temperatures, nitrogen has a diffusion coefficient D in the silicon carbide equal to $5 \times 10^{-12}$ cm²s⁻¹, oxygen has diffusion coefficient D equal to $1.5 \times 10^{-16}$ cm²s⁻¹, whereas boron has a diffusion coefficient D equal to $2.5 \times 10^{-13}$ cm²s⁻¹.

In the silicon, instead, boron has a diffusion coefficient equal to $2.5 \times 10^{-13}$ cm²s⁻¹ at a temperature of about 1150° C. Thus it has about the same diffusion in silicon as it does in silicon carbide at a much more lower temperature.

The diffusion of dopant species, used for forming the doped regions necessary for the formation of power electronic devices, is thus a problematic technical factor in the case of silicon carbide substrates.

A solution in the form of a known technique for manufacturing MOSFET devices integrated on silicon carbide substrates is described in the article by J. Tan, J. A. Cooper, M. R. Melloch, IEEE vol 19, n 12, Dec. 1998, published by the University of Purdue (USA).

As shown in FIG. 1 of the present application, a MOSFET device is formed on a substrate of the 4H SiC type and of N+ type which is overlapped by a drift region of the N− type.

Above such drift region a first epitaxial layer of the N type of thickness tn and a layer of the P type forming the MOSFET transistor base region are formed in sequence. In this latter layer of the P type, a layer of the N+ type is formed. A plurality of trenches are then formed in the layer of the P type and in the first epitaxial layer of the N type until the drift region is exposed so as to insulate a portion of the layer of the N+ type, which forms a source region above the base region.

Once a selective implantation of P regions has been carried out inside the trenches, an epitaxial layer of the N type and then an oxide layer are grown on the whole device and inside the trenches. The final device is then completed with the usual metallization steps for the formation of the gate region, and of the contacts of the integrated device thus obtained.

Although advantageous in several aspects, the formation of such a device implies complex and non industrialized processes.

A technical problem underlying the present disclosure is that of devising a method for manufacturing electronic devices integrated on a semiconductor substrate wherein the doped species have a low diffusivity coefficient, such as for example silicon carbide having such characteristics as to allow the formation of such electronics devices with a high efficiency, thus overcoming the problem linked to the diffusivity of the dopant species, which limits the devices formed according to the prior art.

BRIEF SUMMARY

The present disclosure is directed to manufacturing an electronic device on a semiconductor substrate, for example silicon carbide, wherein the superficial doped regions are uniquely defined by means of ion implantations of suitable dopant species. In particular, such superficial doped regions of the electronic device are defined, in depth and concentration, by localizing dopant elements in the semiconductor substrate by means of suitable ionic implants and without making use of diffusion thermal processes.

On the basis of such solution idea the technical problem is solved by a method as previously indicated and defined by the steps of forming a screening structure on said semiconductor substrate having at least one dielectric layer which leaves a plurality of areas of said semiconductor substrate exposed; carrying out at least a ion implantation of a first type of dopant in said semiconductor substrate for forming at least a first implanted region; and carrying out at least a ion implantation of a second type of dopant in said semiconductor substrate for forming at least a second implanted region inside said at least a first implanted region.

Another embodiment is directed to a device as previously indicated and defined by at least one first implanted region of a first type of conductivity, at least a second implanted region of a second type of conductivity formed inside said at least a first implanted region, a channel region defined between said at least a first and said at least a second implanted region, a gate region projecting from said substrate and insulated therefrom by means of a dielectric layer, said gate region being partially overlapped onto said first implanted region and substantially aligned with said second implanted region.

In accordance with another embodiment of the present disclosure, a method is provided that includes forming a first implanted region with a first type dopant on a wide band gap type of semiconductor substrate material, forming a second implanted region using a second type dopant on the semiconductor substrate, and subjecting the first type dopant and second type dopant to a temperature adapted to activate the first and second type dopants without causing diffusion of the first and second type dopants in the substrate.

In accordance with another aspect of the foregoing embodiment, the temperature is in the range of 1200° C. to 1250° C. More preferably, the temperature is applied for a period in the range of 15 minutes to 10 hours.

BRIEF DESCRIPTION OF THE SEVERAL VIEWS OF THE DRAWINGS

The characteristics and advantages of the method and of the device according to the disclosure will be apparent from the following description of embodiments given by way of indicative and non limiting example with reference to the annexed drawings, wherein.

DETAILED DESCRIPTION

With reference to such figures, a method for manufacturing electronic devices integrated on a semiconductor substrate is described.

The method steps described hereafter do not constitute a complete flow of the process for manufacturing integrated circuits. The present disclosure can be put into practice together with the manufacturing techniques of the integrated circuits currently used in the field and only those commonly used process steps necessary for the comprehension of the present disclosure are described.

The figures showing transversal sections of portions of an integrated electronic device during the manufacturing are not drawn to scale but they are instead drawn so as to illustrate the important characteristics of the disclosure.

In particular, with reference to FIGS. 2 to 11, a first embodiment of the method according to the present disclosure for manufacturing, for example, a vertical power MOSFET transistor is shown.

On a semiconductor substrate 1, for example of silicon carbide 4H—SiC of the N type, a plurality of active areas are formed delimited by insulating structures not shown in the figures. Inside each active area on the semiconductor substrate 1, a first dielectric layer 2 is formed, for example a thermal oxide or deposited oxide layer. Subsequently, a first conductive layer 3 is formed on the first dielectric layer 2, for example by means of deposition of a polysilicon or metallic layer.

By means of a photolithographic process, including the use of a resist mask, elementary strips are for example defined in the resist mask. Then, the conductive layer 3 and the dielectric layer 2 are selectively etched in sequence to form gate regions 3a of the final device which, in this preferred embodiment, have the shape of elementary strips. Such gate regions 3a thus act as a screening structure for portions of the semiconductor substrate 1 during successive implantation steps.

Nothing forbids the semiconductor substrate 1 areas left exposed by the gate regions 3a from having a different shape with respect to those of elementary strips and are of polygonal shape or other suitable shape.

According to the disclosure, implanted regions are then formed in the semiconductor substrate 1 by means of ion implantations following which a single low thermal budget activation process is conducted suitable to complete the formation of these implanted regions, i.e., this process is not followed by any other thermal process that allows the diffusion of the dopant species implanted in the semiconductor substrate 1.

Figure 1:
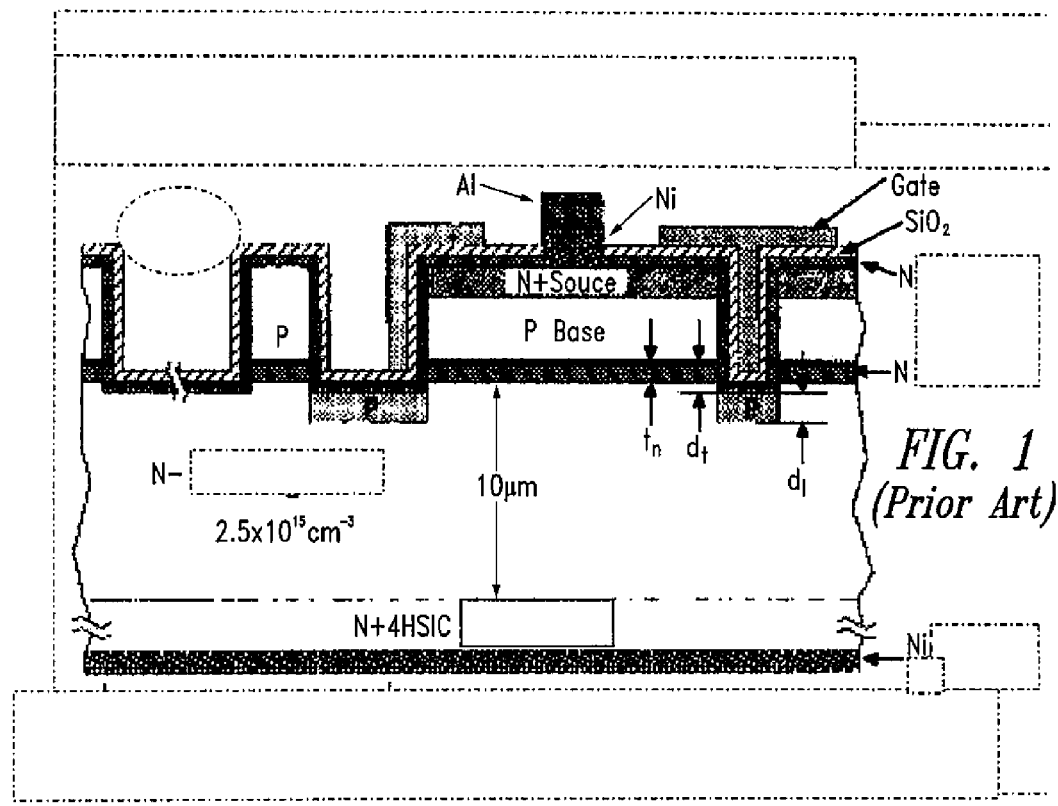
FIG. 1 shows a vertical section of a known MOSFET transistor integrated in a silicon carbide substrate, formed according to known methods.
Figure 2:
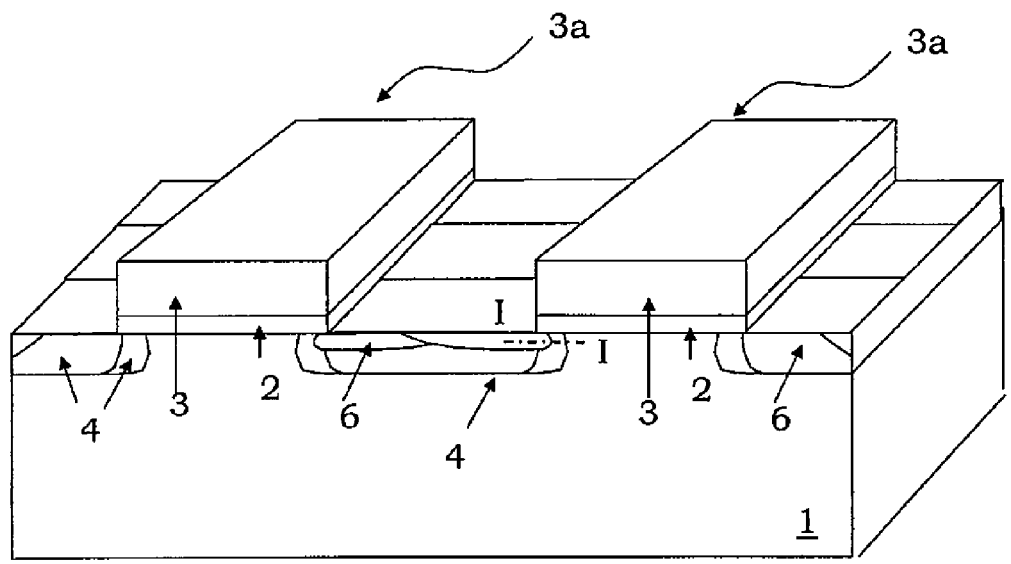
FIG. 2 shows a vertical section of a vertical MOSFET transistor integrated in a semiconductor substrate formed according to the a first embodiment of the method according to the present disclosure.
Figure 3:
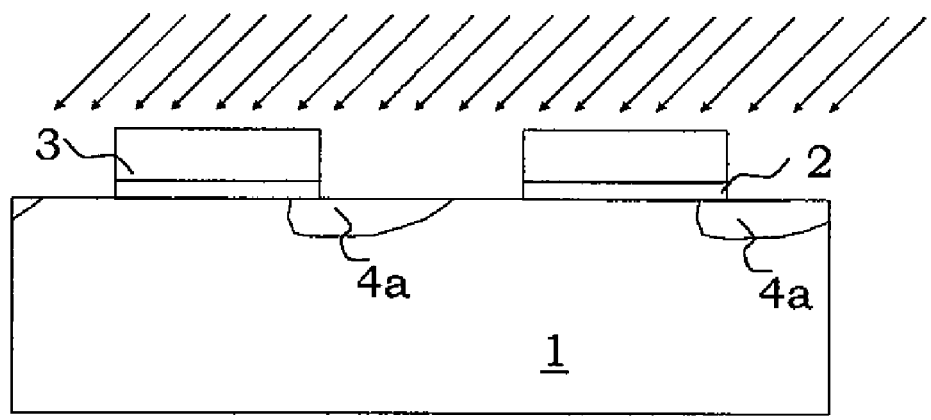
FIGS. 3 to 11 show vertical sections of the MOSFET transistor of FIG. 2 during different manufacturing steps of the first embodiment of the method according to the present disclosure.

For example, as shown in FIG. 3, a first ion implantation is carried out of a first dopant species suitable to form a first portion 4a of a body well 4 to form a channel region. Such first ion implantation is carried out, for example, with boron or aluminium ions with a concentration that varies from $1\times10^{13}$ at/cm$^2$ to $1\times10^{14}$ at/cm$^2$ and an implant energy that varies between 30 and 80 keV and carried out inclined or angled with respect to the surface of the semiconductor substrate 1. Advantageously, the inclination angle with respect to a normal to a plane defined by the semiconductor substrate 1 varies in a range between 30° and 60° and in one embodiment is equal to 45°.

Figure 4:
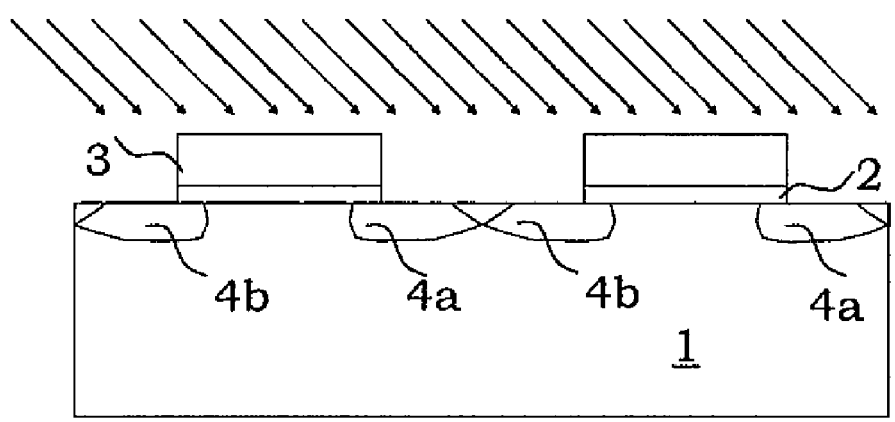

A second ion implantation of the first dopant species is then carried out suitable to form a second portion 4b of the body well 4 to form the channel region. Such second ion implantation is carried out for example with boron or aluminium ions with a concentration that varies from $1\times10^{13}$ at/cm$^2$ to $1\times10^{14}$ at/cm$^2$ and an implant energy that varies between 30 and 80 keV and carried out inclined or angled with respect to the surface of the substrate 1. Advantageously, the inclination angle with respect to the normal to the plane defined by the semiconductor substrate 1 varies in a range between −30° and −60° and in one example it is equal to −45°, as shown in FIG. 4, the negative sign indicating that the inclination angle of the second ion implantation is on the opposite part of the normal with respect to the inclination angle of the first ion implantation.

Figure 5:
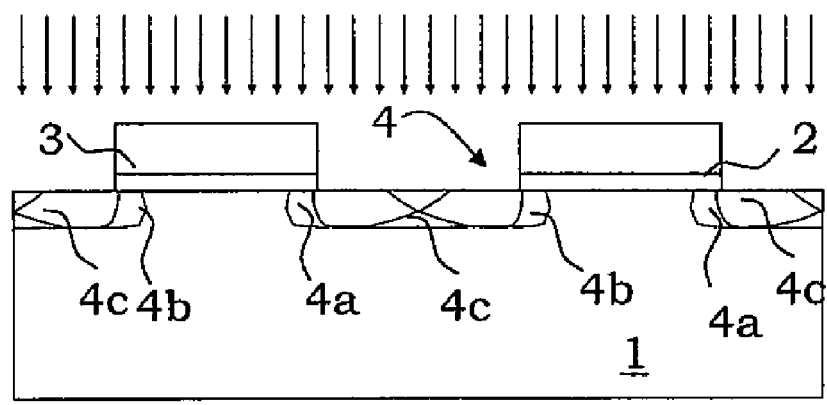

Advantageously, a third ion implantation of the first dopant species is carried out suitable to form a third portion 4c of the body well 4 to form the channel region. Such third ion implantation is carried out for example with boron ions with a concentration that varies from $1\times10^{13}$ at/cm$^2$ to $1\times10^{14}$ at/cm$^2$ and an implant energy in the range of 30-200 keV and carried out along the normal to the plane defined by the semiconductor substrate 1, i.e., perpendicularly with respect to its surface, as shown in FIG. 5. The body well 4 thus formed is partially overlapped by the gate region 3a.

Figure 6:
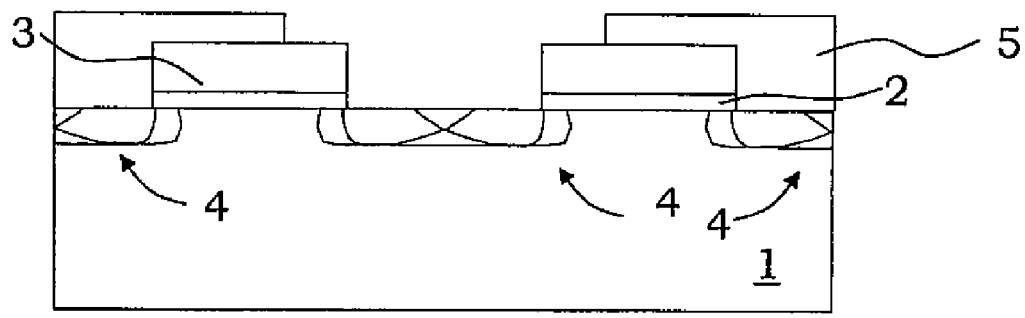

By means of a lithographic process including the use of a second resist mask 5, the whole semiconductor substrate 1 is covered except for areas aligned with portions of substrate 1 wherein source regions will be formed, as shown in FIG. 6.

Figure 7:
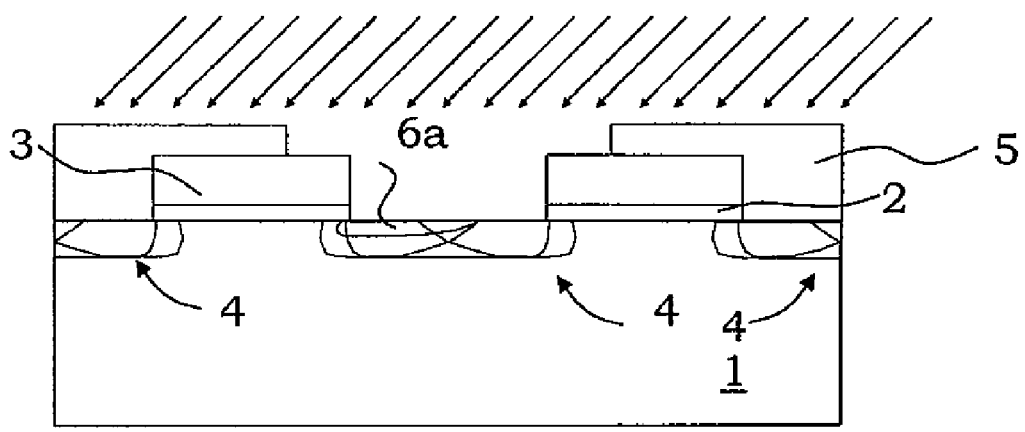

A first ion implantation of a second dopant species suitable to form a second portion 6b of the source region 6 inside the body well 4, as shown in FIG. 7, is then carried out. Such second ion implantation is carried out for example with phosphorus or nitrogen or antimony ions with a concentration that varies from $5\times10^{14}$ at/cm$^2$ to $5\times10^{15}$ at/cm$^2$ and an implant energy in the range of 30-80 keV, and carried out inclined or angled with respect to the substrate 1 surface. Advantageously, the inclination angle with respect to the normal to the plane defined by the semiconductor substrate 1 varies in a range between 30° and 60° and for example it is equal to 45°, as shown in FIG. 7.

Figure 8:
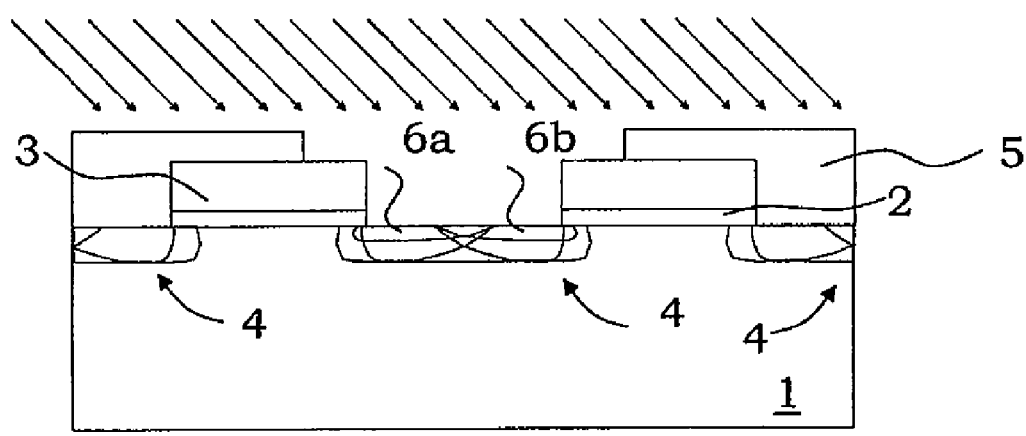

A second ion implantation of a second dopant species suitable to form a second portion 6b of the source region 6 inside the body well 4 is carried out. Such second ion implantation is carried out for example with phosphorus or nitrogen or antimony ions with a concentration which varies from $5\times10^{14}$ at/cm$^2$ to $5\times10^{15}$ at/cm$^2$, and an implant energy in the range of 30-80 keV, and carried out inclined or angled with respect to the substrate 1 surface. Advantageously, the inclination angle with respect to the normal to the plane defined by the semiconductor substrate 1 is varied in a range from −30° to −60° and, in one embodiment, it is equal to −45°, as shown in FIG. 8. The negative sign indicates a different quadrant with respect to the inclination angle of the first ion implantation.

Figure 9:
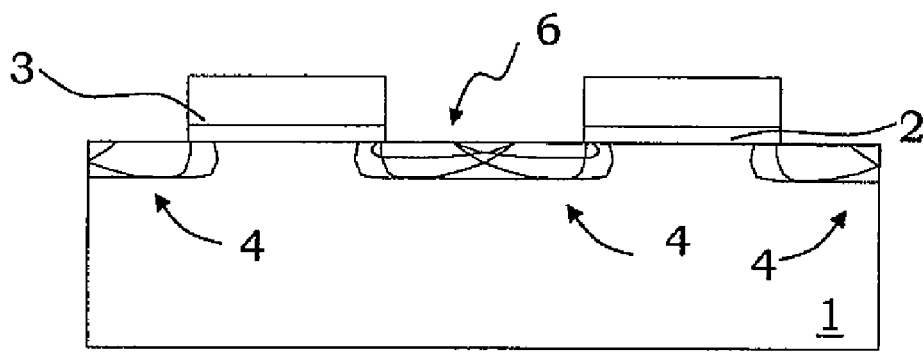

Once the second photo-resist mask 5 is removed, as shown in FIG. 9, a single activation thermal process of the implanted dopant species is carried out to complete the implanted regions.

In this first embodiment, where the gate region 3a of the device is already formed on the semiconductor substrate 1 surface and thus subjected to the activation process, such thermal process must be compatible with the material forming the gate region 3a, for example polysilicon. In particular, the activation thermal process is then carried out at a temperature of less than 1600° C., and in one embodiment between, i.e., in the range of, 1200 and 1250° C. for a time between, i.e., in the range of, 15 min and 10 hours.

As already pointed out, a thermal process at such temperatures, in the case of a substrate formed in silicon carbide, is to be considered with low thermal budget, i.e., insufficient temperature to carry out the diffusion of the dopant species implanted in the substrate 1. Thus, advantageously according to the disclosure, the doped regions forming the electronic device thus formed are uniquely defined by means of the implant parameters, i.e., the angle, energy and implant dose.

Moreover, the method according to the present disclosure can be validly used with semiconductor substrates different from silicon carbide, wherein the implanted doped regions are uniquely defined by means of the implant parameters, and the implanted dopant species are activated only by low thermal amount processes, i.e., processes wherein the temperatures employed are insufficiently high to carry out the diffusion of the implanted dopant species, such process realizing an activation of the dopant species, but not their diffusion.

In particular, the method according to the present disclosure can be validly applied to all the semiconductor materials with wide band gap, i.e., to those materials with an energy value Eg of the band gap higher than that of silicon, which is equal to 1.1 eV.

Still, the method can be validly applied to all semiconductor materials, such as for example gallium nitride (GaN), wherein the dopant species have a low diffusivity coefficient and for which no thermal diffusion processes are desired to be used.

It is also possible to realize the activation process of the dopant by means of a standard thermal process, as previously described, or a combination of standard thermal process and laser annealing or only laser annealing. The laser annealing process is for example realized at a wave length lower than 308 nm with an energy comprised between 700 and 1500 mJ/cm$^2$.

Figure 10:
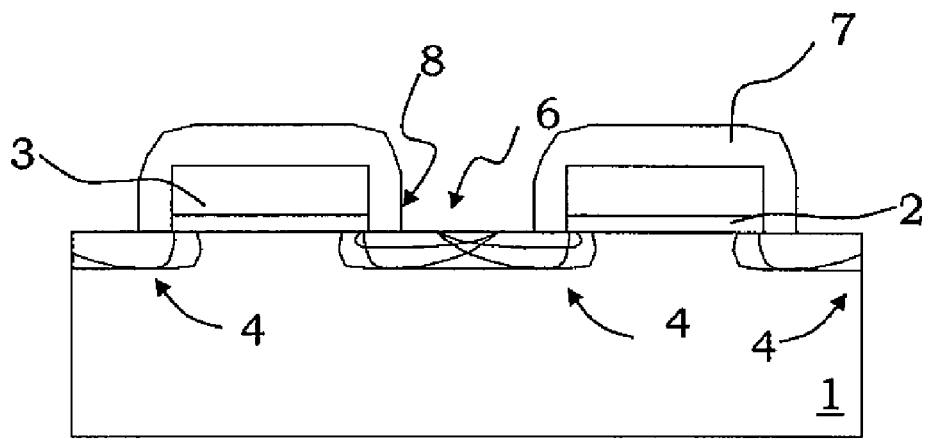
Figure 11:
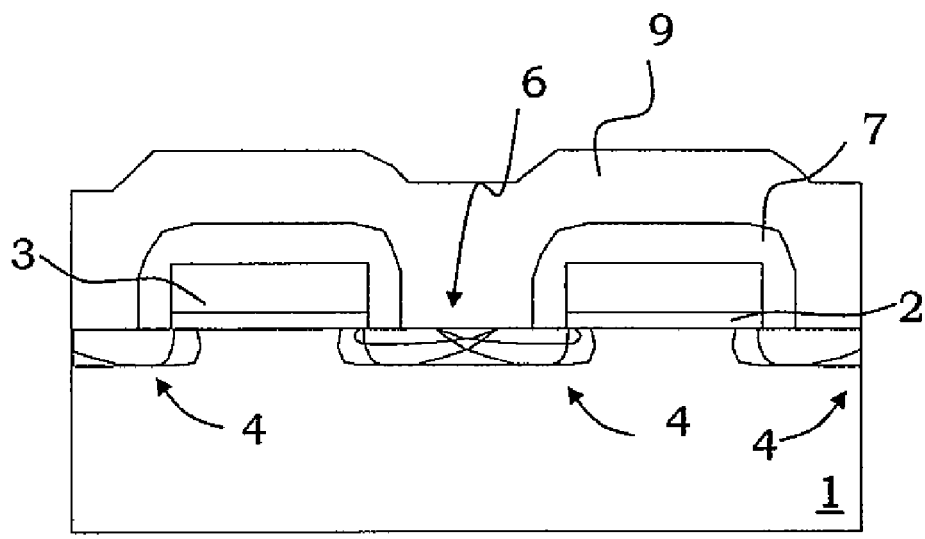

The device is then completed, by means of conventional process steps, which include:
- a covering step by means of a dielectric layer 7 wherein openings 8 for the contacts are formed, as shown in FIG. 10;
- possible formation of a microtrench to improve the body contact;
- a formation step of a metallization layer 9, as shown in FIG. 11 and finishing of the back of the substrate 1.

Figure 12:
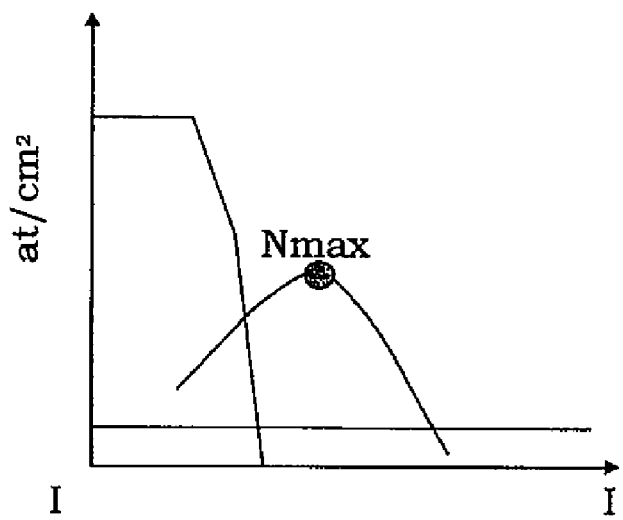
FIG. 12 shows a concentration profile of the MOSFET transistor of FIG. 2 along a section I-I.

It is to be pointed out that, advantageously, the device obtained with this first embodiment of the method according to the present disclosure, has a doping profile that, along the channel region comprised between the body region 4 and the source region 6, has a Gaussian profile with a concentration peak next to the medium point of the channel region, as shown in FIG. 12.

Advantageously, with a suitable control of dose and energy of the angled implants it is possible to localize the concentration peak value Nmax, which determines the threshold voltage of the MOS device from the center of the channel region itself, so as to improve the control of the device threshold voltage.

Figure 13:
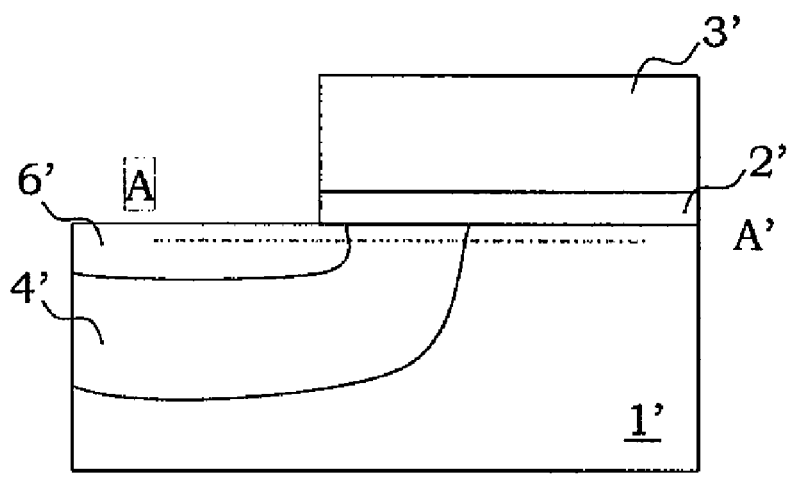
FIG. 13 shows a vertical section of a portion of a known MOSFET transistor formed according to a known method.
Figure 14:
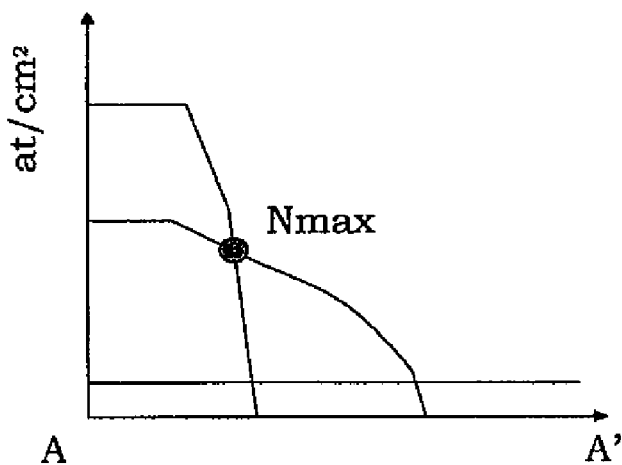
FIG. 14 shows a concentration profile of the MOSFET transistor of FIG. 12 along a section A'-A'.

In known vertical conduction power MOSFET devices, as schematized in FIG. 13, a gate region 3' is formed and insulated from a semiconductor substrate by means of a gate oxide layer 2', and it includes a body well 4' formed in the semiconductor substrate 1' wherein a source region 6' is formed. The peak value Nmax of the concentration profile of the channel region stays almost at the interface with the source region 6', as shown in FIG. 14.

Advantageously, with this embodiment of the method according to the present disclosure, MOSFET devices are formed with a "short" channel that is lower than 0.5 μm. In fact, by forming all the implanted regions they form the channel region, i.e., the body well and the source region, through angled ion implantation, the dimension of the channel region is limited by the projected range of the implanted species, i.e., by the distance a determined species can pass through the interior of a semiconductor material for a determined implantation energy.

By using this first embodiment of the method, it is possible to form also a horizontal power MOS transistor as hereafter described. Elements that are structurally and functionally identical with respect to the vertical power MOSFET transistor illustrated in FIGS. 2-11 will be given the same reference numbers.

Figure 22:
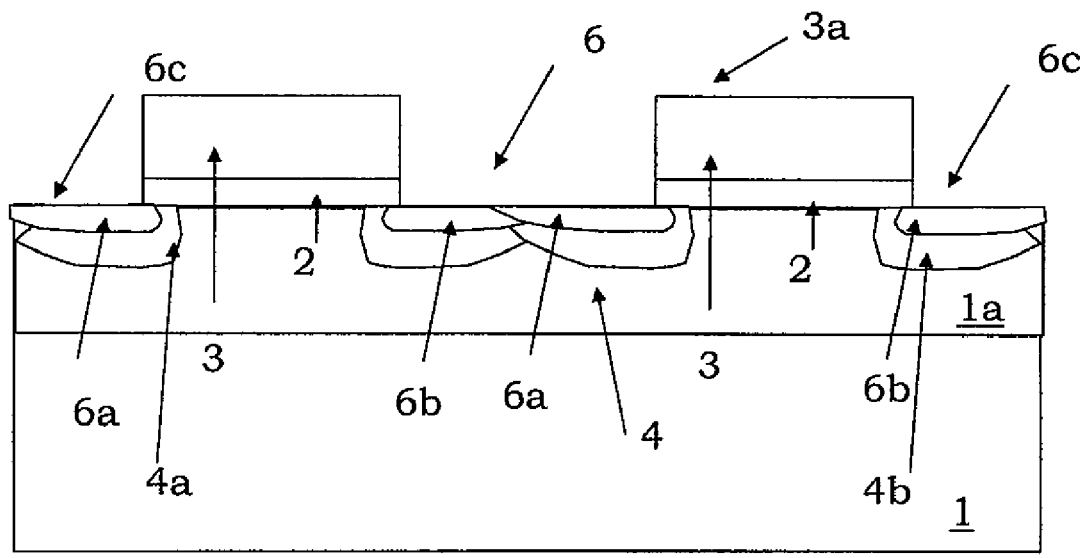
FIG. 22 shows a vertical section of a horizontal MOSFET transistor formed according to the first embodiment of the method according to the present disclosure.

As shown in FIG. 22, on a semiconductor substrate 1, for example of silicon carbide 4H of the N type, a first semiconductor layer 1a is formed, for example of silicon carbide of the P type through, for example, epitaxial growth. In this first layer 1a a plurality of active areas are formed, which are delimited by insulating structures not shown in the figures.

Inside each active area on the first layer 1a, a dielectric layer 2 is formed, for example a thermal oxide or deposited oxide layer.

Subsequently, a conductive layer 3 is formed on the dielectric layer 2, for example by means of deposition of a polysilicon or metallic layer.

By means of a photolithographic process, which implies the use of a resist mask, elementary strips are, for example, defined in the resist mask. Then the conductive layer 3 and the dielectric layer 2 are selectively etched in sequence to form gate regions 3a of the final device which, in this preferred embodiment, have the shape of elementary strips. Such gate regions 3a thus act as a screening structure for portions of the semiconductor substrate 1 during successive implantation steps.

According to this embodiment, a first and a second ion implantation are carried out of a first dopant species suitable to form a first and a second portion 4a, 4b of a body well 4 to form a channel region and control the threshold voltage of the device, with the same modes described to form the first and the second portion 4a, 4b of the body well of the vertical power MOSFET transistor described in relation to FIGS. 2-11.

A first and a second ion implantation are then carried out of a second dopant species suitable to form, in the body well 4, first and second portions 6a, 6b of opposite source and drain regions 6, 6c. Such first and second ion implantation are carried out with the same modes described to form the first and the second portion 6a, 6b of the source region of the vertical power MOSFET device described in relation to FIGS. 2-11.

The process is then completed with an activation thermal process of the dopant species implanted as previously described for the vertical power MOSFET transistor. The device is then completed by means of conventional process steps.

With reference to Figures from 15a,b to 21, a second embodiment of the method according to the present disclosure is described.

On a semiconductor substrate 10, for example of silicon carbide 4H—SiC, a plurality of active areas are formed that are delimited by insulating structures not shown in the figures. Inside each active area on the semiconductor substrate 10, a first dielectric layer 20 is formed, for example by means of deposition of about 5000 Å of TEOS, or growth of a thin silicon oxide layer followed by a deposition of silicon nitride of about 1000 Å and by one of TEOS of about 5000 Å. By means of a photolithographic process, which implies the use of a resist mask 31, elementary strips are defined in the resist mask 31.

Figure 16:
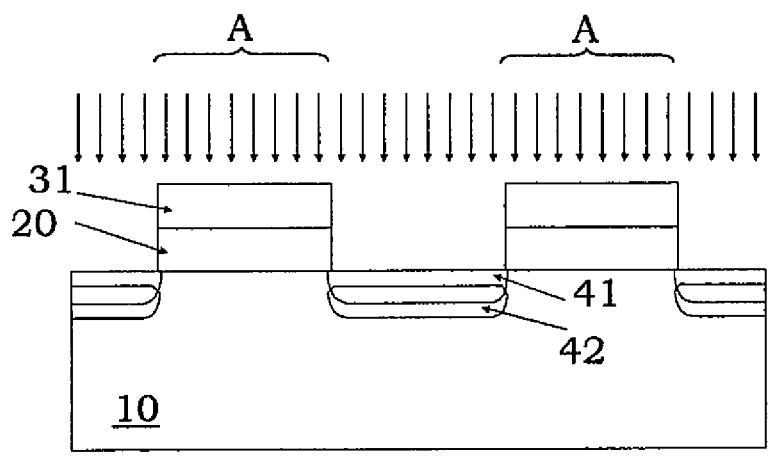
FIGS. 16 to 21 show vertical sections of the MOSFET transistor of FIG. 15a during different manufacturing steps of the second embodiment of the method according to the present disclosure.

As shown in FIG. 16, the dielectric layer 20 is selectively etched 20 to form thick dielectric strips of width A, always indicated with 20. Such strips 20 thus act as a screening structure for portions of the semiconductor substrate 10 during successive implantation steps. Nothing forbids the semiconductor substrate 10 areas left exposed by the dielectric strips 20 from having a different shape with respect to those of the elementary strips, such as a polygonal shape or other suitable shape.

Implanted regions are then formed in the semiconductor substrate 10 by means of ion implantations whereto a single activation thermal process with low thermal budget or temperature is made, following which suitable steps are taken to complete the formation of these implanted regions, i.e., this process is not followed by any other thermal process that allows the diffusion of the dopant species implanted in the semiconductor substrate 1.

A first ion implantation is then carried out of a first dopant species suitable to form a first portion 41 of a body well 40 for the formation of the channel region. Such first ion implantation is carried out for example with boron or aluminium ions and with a concentration that varies between $1\times10^{13}$ at/cm$^2$ and $1\times10^{14}$ at/cm$^2$ and an implant energy in the range of 30-80 keV.

At this point, a second ion implantation is carried out of the first dopant species suitable to form a second deep portion 42 of the body well 40 to sustain the electric field during the cut-off step and to reduce the gain of parasite transistors which are formed in the semiconductor substrate 10. Such second ion implantation is carried out for example with boron or aluminium ions with a concentration that varies between $5\times10^{13}$ at/cm$^2$ and $5\times10^{14}$ at/cm$^2$ and an implant energy in the range of 300-500 keV, as shown in FIG. 16.

Once the resist mask 31 is removed, a deposition or growth step of a stopping layer is advantageously carried out for the successive etching, for example in the range of 50-500 Å of silicon oxide or nitride, not shown in the figures.

A sacrificial layer of suitable thickness is then deposited for the formation of implant spacers, for example in the range of 3000-7000 Å of polysilicon. It is to be noted that the thickness of the sacrificial layer determines the channel length of the MOS device, as will be made clear hereafter. An etching step is then carried out, for example of the dry type, of the sacrificial layer to form spacers 43 on the walls of the strips 20 of thick dielectric.

Figure 17:
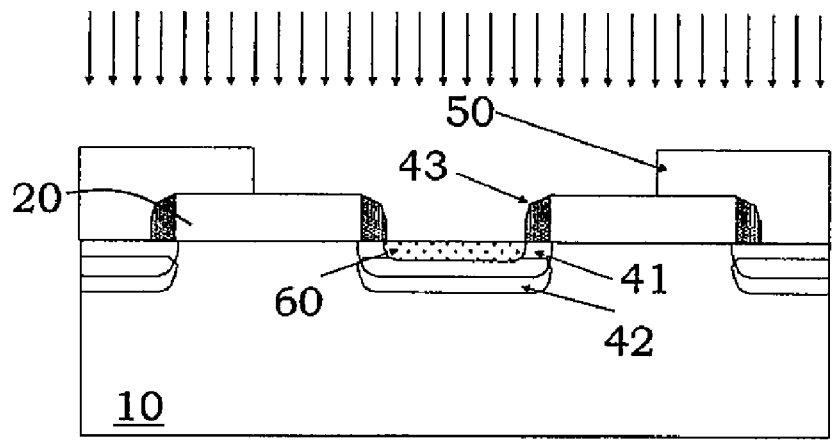

By means of a photolithographic process which implies the use of a second resist mask 50, all the semiconductor substrate 10 is covered except for areas aligned with the portions of substrate 10 wherein source regions will be formed, as shown in FIG. 17. A first ion implantation of a second dopant species is carried out suitable to form a source region 60. Such first ion implantation is carried out for example with phosphorus, nitrogen, or aluminium ions with a concentration that varies between $5 \times 10^{14}$ at/cm$^2$ and $5 \times 10^{15}$ at/cm$^2$ and an implant energy in the range of 30-80 keV.

Figure 15A:
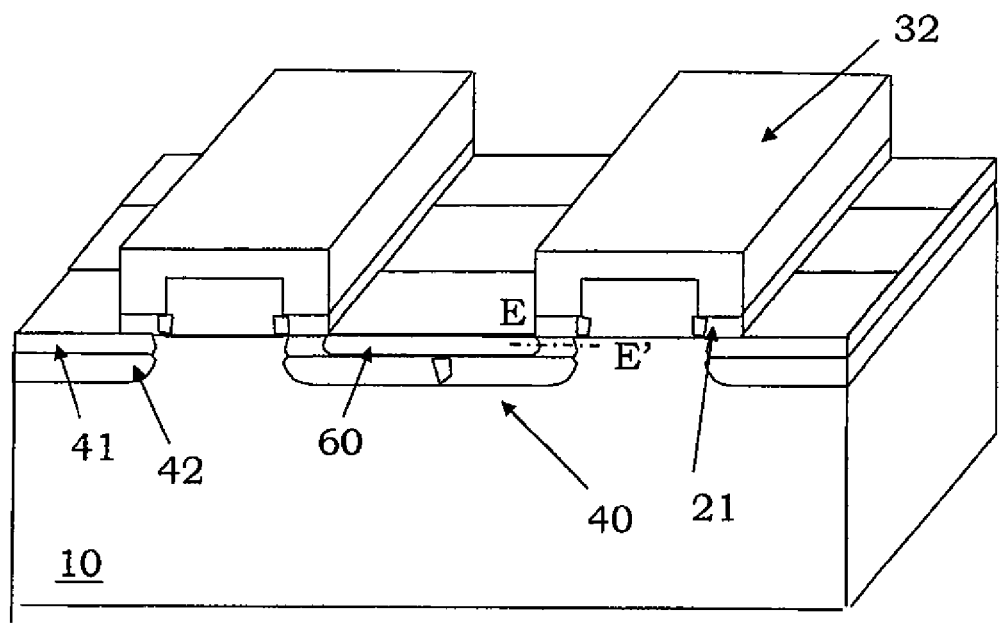
FIG. 15a shows a vertical section of a vertical MOSFET transistor integrated in a semiconductor substrate formed according to a second embodiment of the method according to the present disclosure.
Figure 15B:
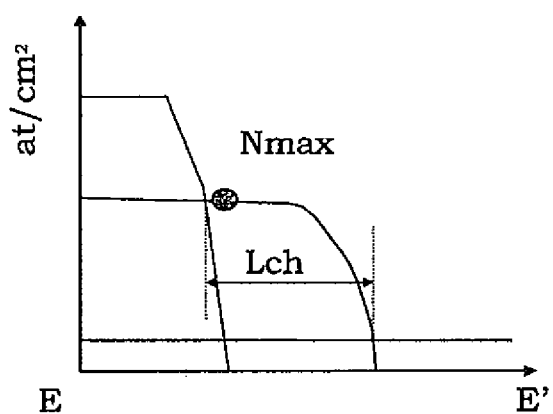
FIG. 15b shows a concentration profile of the MOSFET transistor of FIG. 15a along a section E-E'.

The doping profile that is obtained along the width Lch of the channel region for the integrated device by using this second embodiment of the method exhibits a substantially constant profile of value equal to about Nmax for at least a third of the width Lch, as shown in FIG. 15b.

Once a removal step of the sacrificial spacers 43 is carried out, for example in wet, in particular by means of dipping into a solution of KOH, a single activation thermal process of the dopant species is carried out to complete the implanted regions 40 and 60.

In this second embodiment, a gate region of the device has not been formed yet during the activation step of the dopant, therefore such process, in the case of a substrate of silicon carbide, can occur at a higher temperature with respect to the previous embodiment, for example at a temperature in the range of 1400 and 1600° C. for a time in the range of 15 min and 5 hours.

Advantageously, by carrying out the activation thermal process at a higher temperature with respect to the previous embodiment the amount of electrically active dopant increases and the crystallographic defects introduced during the ion implantation are removed with greater efficiency.

However, also in this embodiment of the method, such activation process allows only the activation and not the diffusion of the dopant species.

As pointed out for the embodiment of the vertical MOSFET transistor described with reference to FIGS. 2-11, also in this embodiment semiconductor materials with wide band gap, different from silicon carbide, can be used for the semiconductor substrate 10.

Figure 18:
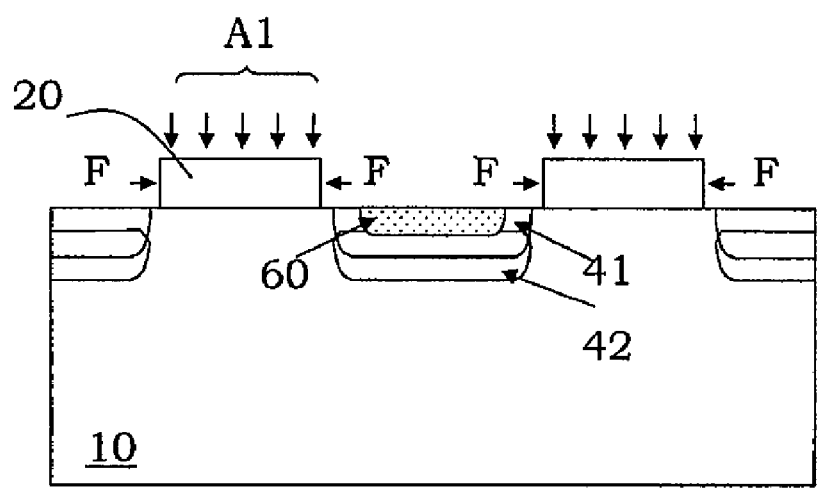

Also in this embodiment, the activation process of the dopant is a standard thermal process, as previously described, or a combination of standard thermal process and laser annealing or only laser annealing. The laser annealing process is for example realized at a wave length less than or equal to 308 nm with an energy in the range of 700 And 1500 mJ/cm$^2$. An etching step of the stopping layer is then carried out if it has been previously formed. Advantageously, the method thus includes an etching step, for example of the timed wet type, of the strips 20 of thick dielectric so as to reduce their width from A to A1 and thus make them go back with respect to the body well 40, as shown in FIG. 18 and indicated by the arrows F.

Once a cleaning step of the device surface has been carried out, a thin dielectric layer 21 is formed on the whole device, for example a silicon oxide layer followed by a deposition of TEDS in the range of 500-1000 Å. A conductive layer 30 is then formed, for example of suitably doped polysilicon, for the formation of the gate region 32.

Figure 19:
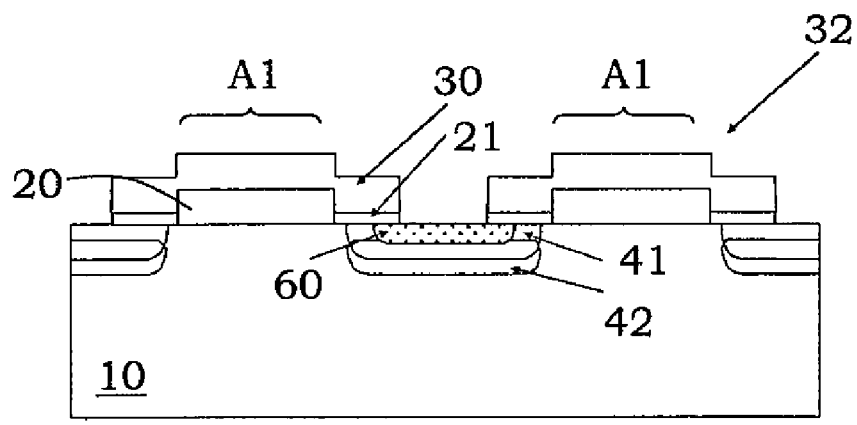

By means of a photolithographic process, which implies the use of a third resist mask, and subsequent etching step of the conductive layer 30 and of the dielectric layer 21, a gate loop 32 is thus defined, as shown in FIG. 19. The gate region 32 is partially overlapped to the body well 40 and insulated therefrom by means of the thin dielectric layer 21 and is substantially aligned with the source region 60.

Thus, in the final device, the gate region 32 is insulated from the semiconductor substrate 10 by means of a dielectric layer 20, 21 which includes a first portion formed by the strips 20 having a first thickness and from a second portion formed by the dielectric layer 21 of a second thickness lower than the first thickness.

Figure 20:
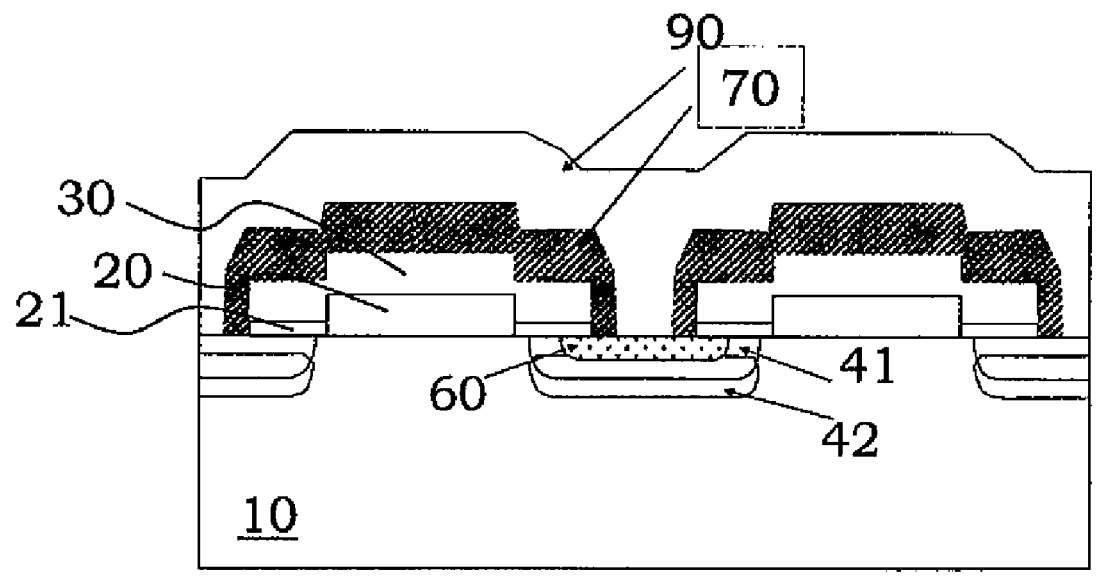
Figure 21:
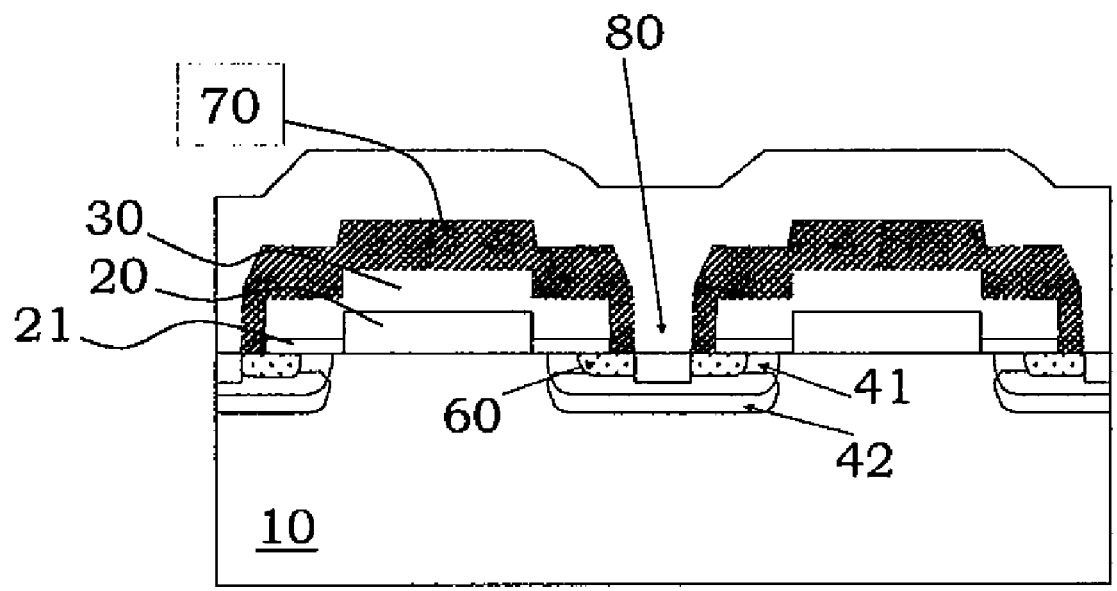

The device is then completed, by means of conventional process steps, which include:
a covering step with a dielectric layer 70 wherein openings are formed for the contacts as shown in FIG. 20;
possible formation of a microtrench 80 to improve the body contact as shown in FIG. 21;
a formation step of a metallization and finishing layer 90 of the back of the substrate 10.

In particular, such second embodiment of the method according to the present disclosure allows:
the formation of MOSFET devices with maximum channel length in the order of μm,
to optimize the dynamic performances of the MOSFET transistor due to the reduction of the capacities associated with the gate oxide layer since the thin oxide layer 21 is present only where necessary, i.e., in correspondence with channel areas.

Figure 23:
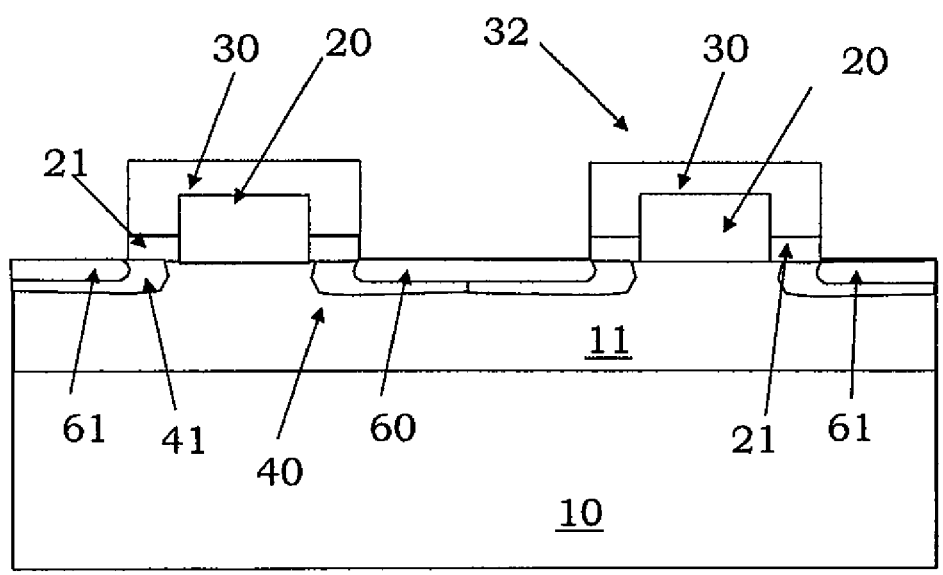
FIG. 23 shows a vertical section of a horizontal MOSFET transistor formed according to the second embodiment of the method according to the disclosure.

By using this first embodiment of the method, it is possible to form also a horizontal power MOS transistor as hereafter described and shown in FIG. 23. Elements that are structurally and functionally identical with respect to the vertical power MOSFET transistor described with reference to FIGS. 15a,b-21 will be given the same reference numbers.

On a semiconductor substrate 10, for example of silicon carbide 4H of the N type, a first semiconductor layer 11 is formed, for example of silicon carbide, of the P type through, for example, epitaxial growth wherein a plurality of active areas being delimited by insulating structures not shown in the figures are formed. Inside each active area, on the first layer 11, a first dielectric layer 20 is formed, for example by means of deposition of about 5000 Å of TEOS, or growth of a thin layer of silicon oxide followed by a deposition of silicon nitride of about 1000 Å and by one of TEOS of about 5000 Å.

By means of a photolithographic process, which provides the use of a resist mask, elementary strips are defined in the resist mask. The dielectric layer 20 is then selectively etched to form strips of thick dielectric of width A, always indicated with 20. A first an possibly a second ion implantation of a first dopant species are carried out suitable to form a first portion 41 of a body well 40 for the formation of the channel and a second portion 41 of the deep body well 40.

Such first and second ion implantation are carried out with the same modes described to form the first and the second portion 41, 42 of the body well 40 of the vertical power MOSFET transistor described with reference to FIGS. 15a, b-21.

A deposition or growth step of a stopping layer is advantageously carried out, for example in the range of 50-500 Å of silicon oxide or nitride, not shown in the figures. A sacrificial layer of suitable thickness is then deposited for the formation of implant spacers, for example in the range of 3000-7000 Å of polysilicon. As it has been seen, the thickness of the sacrificial layer determines the channel length of the MOS device. A dry etching step of the sacrificial layer is then carried out to form spacers on the walls of the thick dielectric strips 20.

The method thus includes an ion implantation of a second dopant species suitable to form opposite source and drain regions 60, 61, carried out with the same modes described to form the source region 60 of the vertical power MOSFET device described with reference to FIGS. 15a,b-21.

Once a removal step of the sacrificial spacers is carried out, for example in wet, in particular, by means of dipping into a solution of KOH, an activation thermal process of the dopant species is carried out as previously described for the vertical power MOSFET transistor. An etching step of the stopping layer, if it has been previously formed, is then carried out. An etching step is then carried out, for example of the timed wet type, of the thick dielectric strips 20 so as to reduce their width from A to A1 and thus make them go back with respect to the body well 40.

Once the cleaning step of the device surface has been carried out, a dielectric layer is formed 21 on the whole device, for example a thin layer of silicon oxide followed by a deposition of TEOS in the range of 500-1000 Å.

A conductive layer 30 is then formed, for example of suitably doped polysilicon, for the formation of the gate electrode. By means of a photolithographic process, which implies the use of a third resist mask and subsequent etching step of the conductive layer 30 and of the dielectric layer 21a gate mesh 32 is thus defined.

Nothing forbids in this second embodiment forming the ion implantations that form the first and the second implanted regions 40, 60 with inclined implantations with respect to the substrate 10.

In this way it is possible to form a device with a channel region lower than 0.5 μm and to carry out a thermal process with high thermal amount, i.e., with a temperature higher than 1250° C.

In conclusion, the method according to the present disclosure allows:
 the formation of MOSFET devices with channel length lower than 1 μm,
 better control of the Vth, and
 the reduction of problems linked to "short channel" effects.

These last two advantages are due to the particular concentration profiles in correspondence with the channel regions that are obtained with the two embodiments described.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing electronic devices on a semiconductor substrate with wide band gap comprising the steps of:
 forming a screening structure on said semiconductor substrate comprising at least a dielectric layer overlapped by an exposed conductive layer forming gate regions of a MOS device, said screening structure leaving a plurality of areas of said semiconductor substrate exposed;
 carrying out first ion implantation of a first type of dopant in said semiconductor substrate to form at least a first implanted region said first ion implantation with an inclination angle with respect to a normal to a surface of said semiconductor substrate which varies between 30° and 60°; and
 carrying out first a ion implantation of a second type of dopant with an inclination angle with respect to a normal to a surface of said semiconductor substrate which varies between 30° and 60° in said semiconductor substrate to form at least a second implanted region inside said at least a first implanted region;
 said method further comprising an activation thermal process of the first type of dopant and second type of dopant at temperatures lower than 1250° C. suitable to complete said formation of said at least first and second implanted regions and in order to obtain a doping profile of said channel region of the Gaussian type with a concentration peak next to a medium point of said channel region.

2. The method for manufacturing electronic devices according to claim 1 wherein a second implantation step of said first type of dopant inclined with respect to a normal to a surface of said semiconductor substrate is carried out to form second portions of said at least a first implanted region.

3. The method for manufacturing electronic devices according to claim 2, wherein second implantation step of the first type of dopant has an inclination angle that varies in the range of −30° and −60° with respect to said normal to the surface of said substrate, the negative sign indicating that said inclination angle of said second implantation step stays on the opposite part of said normal with respect to said inclination angle of said first implantation step.

4. The method for manufacturing electronic devices according to claim 3 wherein said first implantation step of the first type of dopant has an inclination angle of 45° and said second implantation step of the first type of dopant has an inclination angle −45° with respect to said normal to the surface of said substrate, the negative sign indicating that said inclination angle of said second implantation step stays on the opposite part of said normal with respect to said inclination angle of said first implantation step.

5. The method for manufacturing electronic devices according to claim 2 wherein it carried out a third implantation step of the first type of dopant along said normal to the surface of said semiconductor substrate (1, 1a) to form, respectively, a third portion (4c) of said at least a first implanted region (4).

6. The method for manufacturing electronic devices according to claim 1 wherein a second implantation step of the second type of dopant inclined with respect to a normal of a surface of said semiconductor substrate is carried to form, respectively, first and second portions of said at least a second implanted region.

7. The method for manufacturing electronic devices according to claim 6 wherein said second implantation step of the second type of dopant has an inclination angle which varies between −30° and −60° with respect to said normal to the surface of said substrate, the negative sign indicating that said inclination angle of said second implantation step stays on the opposite part of said normal with respect to said inclination angle of said first implantation step.

8. The method for manufacturing electronic devices according to claim 7 wherein said first implantation step of the second type of dopant has an inclination angle of 45° and said second implantation step of the second type of dopant has an inclination angle −45° with respect to said normal to the surface of said substrate, the negative sign indicating that said inclination angle of said second implantation step stays on the opposite part of said normal with respect to said inclination angle of said first implantation step.

9. The method for manufacturing electronic devices according to claim 1 wherein said semiconductor substrate is made of silicon carbide.

10. The method for manufacturing electronic devices according to claim 1 wherein the semiconductor substrate is of a first type of conductivity and comprises, on top, a layer of a second type of conductivity.

11. The method for manufacturing electronic devices according to claim 1 wherein said ion implantation of a first type of dopant is carried out with boron or aluminium ions with a concentration that varies in the range of $1 \times 10^{13}$ at/cm$^2$ and $1 \times 10^{14}$ at/cm$^2$ and an implant energy that varies in the range of 30 and 80 keV.

12. The method for manufacturing electronic devices according to claim 9 wherein said ion implantation of a second type of dopant is carried out with phosphorus or nitrogen or antimony ions with a concentration that varies in the range of $5 \times 10^{14}$ at/cm$^2$ and $5 \times 10^{15}$ at/cm$^2$ and an implant energy that varies in the range of 30 and 80 keV.

13. The method for manufacturing electronic devices according to claim 1 wherein before carrying out said ion implantation of a second type of dopant a mask is formed on said semiconductor substrate to screen a portion of said semiconductor substrate.

* * * * *

UNITED STATES PATENT AND TRADEMARK OFFICE
CERTIFICATE OF CORRECTION

PATENT NO. : 7,713,853 B2
APPLICATION NO. : 11/971113
DATED : May 11, 2010
INVENTOR(S) : Ferruccio Frisina et al.

Page 1 of 1

It is certified that error appears in the above-identified patent and that said Letters Patent is hereby corrected as shown below:

Title Page,
Item 75 Inventors: should read as follows:

"Ferrucio Frisina, Sant' Agata li Battiati (IT); Mario Giuseppe Saggio, Acicastello (IT); Angelo Magri, Belpasso (IT)" should read as --Ferruccio Frisina, Sant'Agata li Battiati (IT); Mario Giuseppe Saggio, Acicastello (IT); Angelo Magri, Belpasso (IT)--.

Signed and Sealed this
Fourth Day of October, 2011

David J. Kappos
*Director of the United States Patent and Trademark Office*